310-335
5/24/83 OR 4,385,255

United States Patent [19]

Yamaguchi et al.

[11] 4,385,255

[45] May 24, 1983

[54] LINEAR ARRAY ULTRASONIC TRANSDUCER

[75] Inventors: Keiki Yamaguchi; Shinichi Sano; Naoki Seki; Masami Imamoto, all of Musashino, Japan

[73] Assignee: Yokogawa Electric Works, Ltd., Tokyo, Japan

[21] Appl. No.: 200,949

[22] Filed: Oct. 27, 1980

[30] Foreign Application Priority Data

Nov. 2, 1979 [JP] Japan ............................. 54-142450
May 8, 1980 [JP] Japan ............................. 55-63165[U]

[51] Int. Cl.³ ............................. H01L 41/22
[52] U.S. Cl. ............................. 310/335; 29/25.35; 128/660; 310/348; 310/366; 361/417
[58] Field of Search .............. 310/334, 335, 348, 331, 310/366; 361/417; 29/25.35, 832, 840, 854, 855, 856; 128/660

[56] References Cited

U.S. PATENT DOCUMENTS

| | | | |
|---|---|---|---|
| 3,387,604 | 6/1968 | Erikson | 310/335 |
| 3,952,387 | 4/1976 | Iinuma et al. | 310/334 |
| 4,211,948 | 7/1980 | Smith et al. | 310/334 |
| 4,217,684 | 8/1980 | Brisken et al. | 29/25.35 |

*Primary Examiner*—J. D. Miller
*Assistant Examiner*—D. L. Rebsch
*Attorney, Agent, or Firm*—Parmelee, Bollinger & Bramblett

[57] ABSTRACT

A linear array ultrasonic transducer is provided primarily for use in a medical diagnostic examination device in which an ultrasonic beam is projected toward an object to be examined, thereby to examine the condition of the tissues of that object. The linear array ultrasonic transducer comprises an array of tiny oscillatory elements and electrode leads connected by a conductive adhesive to facilitate the fabrication, and two registering layers and a lens layer mounted on the front sides of the tiny oscillatory elements so that an image of high resolution may be produced.

6 Claims, 18 Drawing Figures

LINEAR ARRAY ULTRASONIC TRANSDUCER

BACKGROUND OF THE INVENTION

1. Field of the Invention

The present invention relates to a linear array ultrasonic transducer used in an ultrasonic diagnostic examination device, and more particularly to such a transducer in which an ultrasonic beam is projected into an object to be examined, such as a living body, to receive the echoes which are reflected from the boundary between heterogenous bodies having different acoustic impedances.

2. Description of the Prior Art

The construction of and the problems concomitant with a transducer according to the prior art will now be described.

Referring to FIG. 1 which is a perspective view showing an oscillatory array portion of a transducer, the transducer includes an oscillatory element 1*a* which is made of a material such as PZT (i.e., piezoelectric element of Lead Zirconate-Titanate). Electrode layers 1*b* and 1*c* are provided on both sides of the oscillatory element 1*a*. Oscillatory element 1*a* thus formed with the electrode layers 1*b* and 1*c* usually is a member of a large plate-shaped oscillator. This part of the plate-shaped oscillator is adhered to a backing member, which will be described later, and is then cut thin into an array form, as shown in FIG. 1. The single thin cut element from the oscillatory element 1*a* is indicated as a tiny oscillatory element 11. A backing member 2 absorbs the ultrasonic waves directed to the back of the array of the tiny oscillatory elements 11.

In order to clearly produce the image which is obtained by the ultrasonic diagnostic examination device using such a transducer, a variety of means have been employed, including such means relating to the transducer as follows:

(1) The oscillatory frequency of the ultrasonic waves is increased;

(2) A side lobe is reduced in the directive characteristics of the ultrasonic beam; and (3) The ultrasonic beam is made thin and sharp.

As has been described above, such means involved the construction of the tiny oscillatory elements having a rectangular shape which are made thinner.

The operation of the transducer shown in FIG. 1 is as follows. For example, five tiny oscillatory elements 11 are gathered into one group, and the electrode layers of any of the tiny oscillatory elements are denoted $a_K$ and $b_K$, the electrode layers $a_1$ to $a_5$ and $b_1$ to $b_5$ are electrically connected (although the respective tiny oscillatory elements are acoustically insulated), and a pulsed voltage signal is applied between the electrode layers $a_1$ to $a_5$ and $b_1$ to $b_5$ so that one ultrasonic beam is transmitted from that group of the tiny oscillatory elements. A number of such groups are arranged in an array to transmit the ultrasonic beam consecutively, thereby to effect the scanning operation.

FIG. 2 is a perspective view showing one tiny oscillatory element. In order to realize the aforementioned means (2), if the thickness and width of the tiny oscillatory element are denoted as t and W, respectively, as is disclosed in May, 1977 "Proceedings of Japanese Ultrasonic Medical Association", page 53, the ratio of W/t is desired to be equal to or less than 0.6. For example, therefore, in order to generate ultrasonic waves having a frequency of 5 MHz, the thickness t of the tiny oscillatory element has to be about 0.25 mm, and the width W has to be about 0.15 mm.

Electrode leads for driving such tiny oscillatory elements, according to the prior art, have been attached to the electrode layers 1*b* and 1*c* by a bonding process. This bonding process involves bonding the leads one by one to the tiny oscillatory elements (generally, about three hundred in number having a width of 0.15 mm) which required skilled working techniques and is time consuming. As a result, the bonding process has been an intrinsic cause for the failure of the apparatus in which the array is incorporated. It has been extremely difficult to complete the bonding of the tiny oscillatory elements as many as three hundred times without any failure occurring.

SUMMARY OF THE INVENTION

It is an object of the present invention to provide a linear array ultrasonic transducer which can be easily fabricated.

Another object of the present invention is to provide a linear array ultrasonic transducer which partly sharpens the directivity of an ultrasonic beam and partly reduces the side lobe so that it can obtain a clear image.

In carrying out this invention in one illustrative embodiment thereof, a linear array ultrasonic transducer is provided having a plurality of tiny oscillatory elements arranged in the form of an array and electrode leads therefor are connected by means of a conductive adhesive. Two registering layers and an acoustic lens layer are mounted on the front side of the tiny oscillatory elements.

BRIEF DESCRIPTION OF THE DRAWINGS

The invention together with further objects, aspects and advantages thereof will be more clearly understood from the following description taken in conjunction with the accompanying drawings in which like elements bear the same reference numerals.

FIGS. 5A to 5C are a series of views illustrating one example of the method of producing the transducer according to the present invention, wherein FIG. 5A is a side elevation and FIGS. 5B and 5C are front elevations.

FIGS. 9A to 9C are views illustrating another embodiment of the transducer according to the present invention, wherein FIG. 9A is a perspective view and FIGS. 9B and 9C are side elevations viewed in the direction of arrow $D_1$ in FIG. 9A.

DESCRIPTION OF THE PREFERRED EMBODIMENTS

Figure 1:
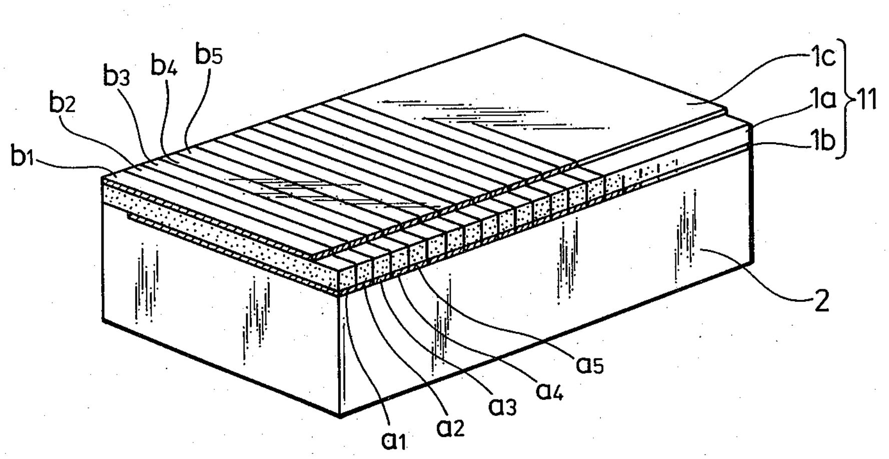
Fig.1 (Prior Art)
FIG. 1 is a perspective view illustrating the construction of an ultrasonic transducer according to the prior art.
Figure 2:
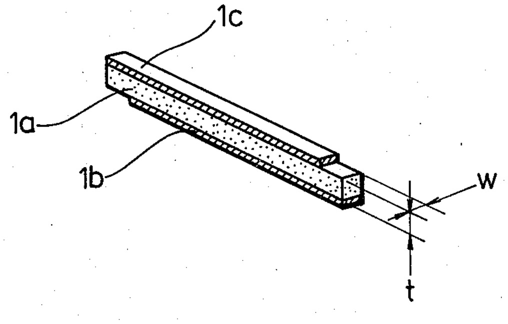
FIG. 2 is a perspective view of an ultrasonic oscillatory element.
Figure 3:
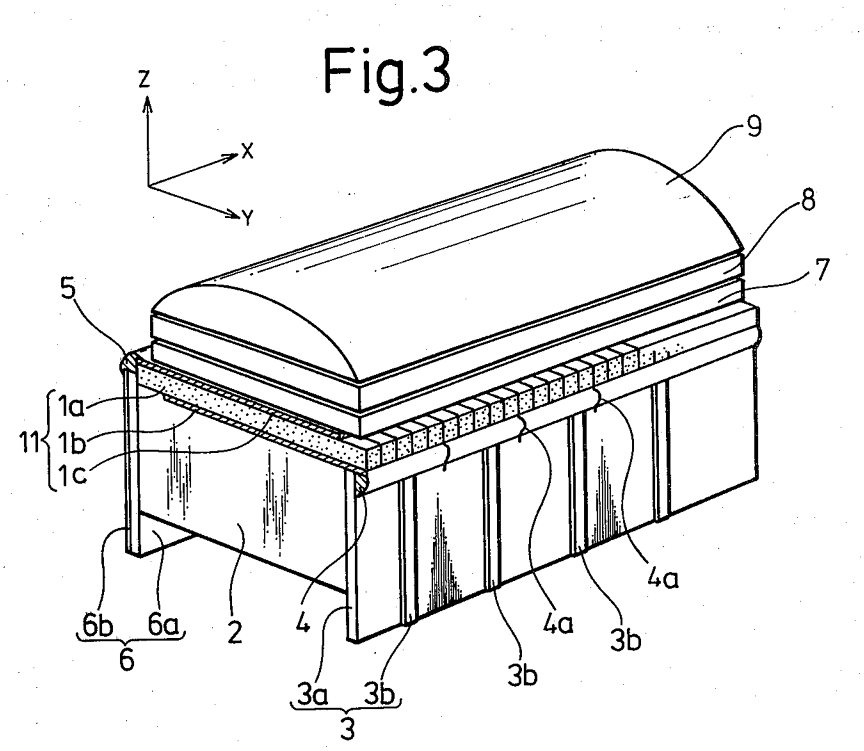
FIG. 3 is a perspective view of one embodiment of the ultrasonic transducer according to the present invention.

Referring now to FIG. 3, the ultrasonic transducer is constructed of rectangular piezoelectric elements 1*a* made of, for example, of piezoelectric ceramic selected from lead zirconate titanates or the like. Rectangular elements 1*a* have electrode layers 1*b* and 1*c* on each side thereof to form tiny ultrasonic oscillatory elements 11. A backing member (or an ultrasonic absorber) 2 made of rubber mixed with metal powders, such as ferrite rubber, is placed on the back sides of the respective tiny ultrasonic oscillatory elements 11. A print plate 3 comprising an insulating substrate 3*a* and a plurality of lead wire patterns 3*b* formed on the insulating substrate 3*a* is so arranged that its end face is substantially at a right angle with respect to one end portion of each of the tiny ultrasonic oscillatory elements 11. Another print plate 6 comprising an insulating substrate 6*a* and a plurality of lead wire patterns 6*b* is formed on the insulating substrate 6*a* and arranged such that its end face is substantially at a right angle with respect to the other end portion of each of the tiny ultrasonic oscillatory elements 11. The lead wire patterns 3*b* function to excite the respective tiny ultrasonic oscillatory elements 11, while the lead wire patterns 6*b* form a common electrode for the respective tiny ultrasonic oscillatory elements 11. A conductive adhesive layer 4 (containing a conductive paint) which is cut and separated, as indicated at cut sections 4*a*, corresponding to the desired number of the plural lead wire patterns is applied to one end portion of the tiny ultrasonic oscillatory elements 11 and an end face of the print plate 3. The conductive adhesive layer 4 thus formed functions to connect the electrode layers 1*b* of the tiny ultrasonic oscillatory elements to the lead wire patterns 3*b* while segregating a plurality of tiny ultrasonic oscillatory elements 11 into one group. A conductive adhesive layer 5 is applied to the other end portions of the tiny ultrasonic oscillatory elements 11 and the end face of the print plate 6 and functions to connect the electrode layers 1*c* of the ultrasonic oscillatory micro-elements 11 and the lead wire patterns 6*b*. Consecutively mounted on the front sides of the respective tiny ultrasonic oscillatory elements 11, are a first matching layer 7 a second matching layer 8 and an acoustic lens 9 which is located at the foremost position.

The operation of the linear array ultrasonic transducer of FIG. 3 having the construction covered thus far will now be described. As shown in FIGS. 3 and 4, the oscillatory elements 11 are cut thin in the form of an array. Cut portions are made as shown in the drawing, such that the conductive adhesive layer 4 is cut every several elements, as indicated at 4*a*. As a result, in response to a single signal, a plurality of (five in the embodiment of FIGS. 3 and 4) the oscillatory elements 11 are simultaneously excited. A plurality of groups each having five oscillatory elements constitute the transducer shown in FIGS. 3 and 4. When ultrasonic waves are to be transmitted from the transducer, the ultrasonic waves, which are diverged in the scanning direction (direction X of FIG. 3), can be condensed by a phased array system which is operative to excite the plurality of groups in a certain time relationship. On the other hand, the ultrasonic waves, which are diverged in the thickness direction (direction Y of FIG. 3), can be converged at the focal point of the acoustic lens 9 by the action of the same lens. The ultrasonic beam thus generated has a sharp directivity in both directions of the X and Y axes.

Next, in order to improve the responsiveness of the transducer, i.e., in order that the respective oscillatory elements may oscillate in the form of a piston to transmit the ultrasonic waves within a short time period, if the width of the oscillatory elements cut into a rectangular shape is denoted by W, the thickness of the same being designated as t, they are selected to satisfy the relationship of $W/t \leqq 0.8$. Generally speaking, since the thickness t of the oscillatory elements for transmitting the ultrasonic waves is made remarkably small, the width W of the cut rectangle must also be made remarkably small in order to satisfy the condition specified above. According to the prior art, on the other hand, since signal electrode leads are bonded to the electrode layers of the oscillatory elements, a space is required for the bonding process. As a result, the width W of the oscillatory elements is required to have a size higher than a preset value, thus making it difficult to satisfy the aforementioned condition of $W/t \leqq 0.8$. Moreover, since the bonding process is effected in a restricted space, the percentage of defective units is remarkably high. According to the present invention, since the electrode layers of the oscillatory elements and the patterns of the print plates are connected in advance by means of the conductive adhesive layers 4 and 5 without any bonding process, the aforementioned drawback concomitant with the conventional bonding process can be obviated. As a result, the width W of the oscillatory elements can be cut sufficiently narrow so that the responsiveness of the same elements can be improved.

Moreover, the side lobe can be reduced due to the fact that the width W of the oscillatory elements is reduced.

It is necessary for the ultrasonic diagnostic examination device to effectively transmit the ultrasonic waves from the transducer into the object to be examined. More specifically, it is not preferred that the ultrasonic waves transmitted from the oscillatory elements be absorbed or relfected in the course of their transmission. According to the present invention, acoustic matching is established between the oscillatory elements 11 and the object by providing first and second matching layers to thereby prevent the ultrasonic waves from being absorbed or reflected. More specifically, the first matching layer 7 is made of glass, the second matching layer 8 is made of a high molecular film, and the acoustic lens 9 is made of silicone rubber. Thus, the acoustic impedance is brought closer and closer to the object to thereby prevent reflection.

Figure 4A:
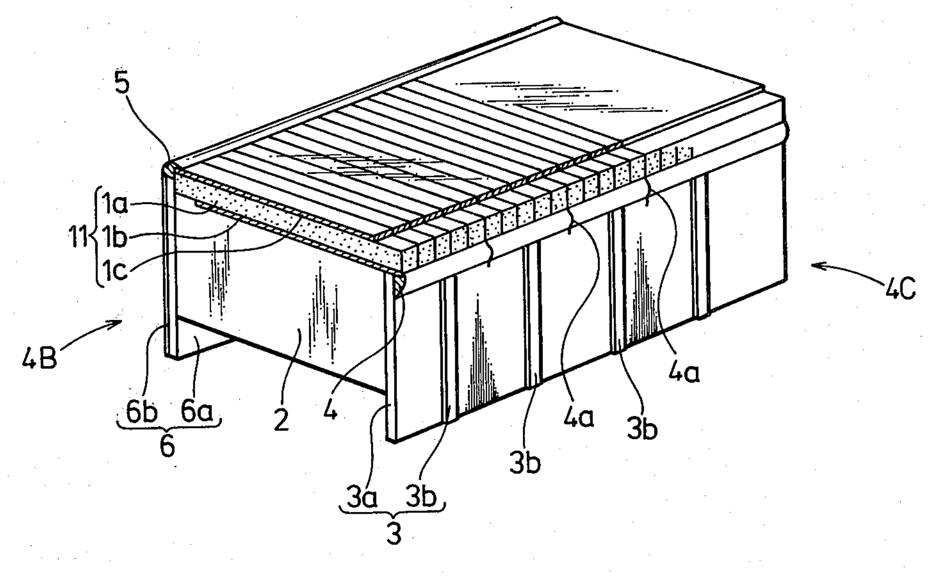
FIG. 4A is a perspective view of the transducer of FIG. 3 with certain parts removed.
Figure 4B:
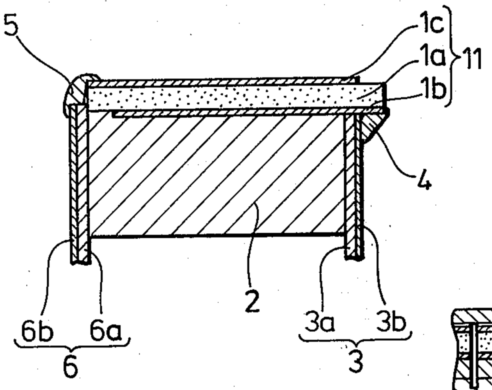
FIG. 4B is a side elevation viewed in the direction of arrow 4B in FIG. 4A.
Figure 4C:
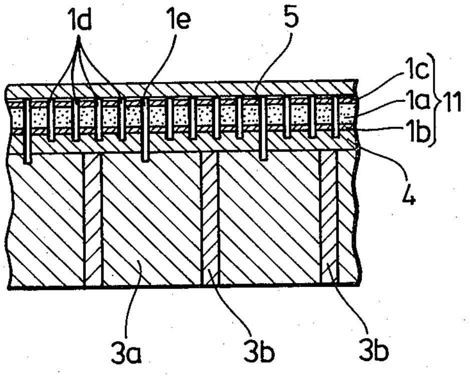
FIG. 4C is a front elevation viewed in the direction 4C in FIG. 4A.

Next, the method of fabricating the transducer having the construction thus far set forth will now be described in the steps as follows:

Step 1: The backing member 2 is adhered to the parts of the oscillatory elements;

Step 2: The print plate 3 is adhered to the backing member 2 partly by arranging the patterns 3*b* to face the outside, as shown in FIG. 4A, and partly by arranging one end of each pattern 3*b* to be in the vicinity of the electrode layer 1*b* of each oscillatory element;

Step 3: The electrode layer 1*b* of the part of each oscillatory element and each pattern 3*b* are connected by means of the conductive adhesive layer 4, as shown in FIGS. 4A to 4C;

Step 4: In the construction thus made, the parts of the oscillatory elements are cut so that the five tiny oscillatory elements 11 are electrically connected with each pattern 3*b* through the conductive adhesive layer 4, as shown in FIG. 4C. More specifically, as shown in FIG. 4C, if the respective cut portions are denoted at 1*d* and 1*e*, the cut depth of the cut portions 1*d* is made so as to cut off the parts of the oscillatory elements completely while avoiding electric separation as far as the conductive adhesive layer 4, whereas the cut depth of the cut portions 1*e* is made so as to sufficiently separate even the conductive adhesive layer 4. As a result, each pattern 3*b*, which is connected with the electrode layers 1*b* of the oscillatory element group composed of the five tiny oscillatory elements, is used as the signal electrode lead; and Step 5: The print plate 6 is adhered, as shown in FIGS. 4A and 4B, to the side of the backing member 2 at the opposite side to that where the print plate 3 is adhered, and the electrode layer 1*c* of each tiny oscillatory element and the electrode layer 6*b* of the print plate 6 are connected by the conductive adhesive layer 5 whereby the electrode layer 6*b* is used as a common electrode lead.

In the aforementioned description of the step 5, the attachment of the common electrode lead has been described such that, after the parts of the oscillatory elements are cut into the tiny oscillatory elements, the electrode layers 6*b* acting as the common electrode lead and the electrode layers 1*c* of the oscillatory elements are connected by means of the conductive adhesive layer 5. However, before the parts of the oscillatory elements are cut, the electrode layers 6*b* and the electrode layers 1*c* may be connected by means of the conductive adhesive layer 5. In either case, the present invention should not be limited to the difference in the attaching means to the common electrode lead.

The conductive adhesive appearing in the Specification implies all that can be adhered at a temperature lower than the Curie point of the oscillatory material and possessing the properties of conductivity and adhesiveness, and includes a conductive adhesive (e.g., a conductive adhesive of epoxy resin) and a conductive paint, but not a solder. This is because the temperature required for the soldering process generally exceeds the Curie point of the material of the oscillatory elements, thereby changing the polarization of the oscillatory material and the properties of the oscillating elements. Moreover, the soldering process has many drawbacks peculiar to the fabrication of the transducer, for example, the blades of a cutter used for cutting the conductive adhesive are liable to be clogged, thereby deteriorating its cutting properties and the oscillatory elements may become warped due to the soldering temperature. However, the conductive adhesive according to the present invention succeeds in eliminating such drawbacks.

In FIG. 4A, after the patterns 3*b* of the signal electrode leads and the electrode layers 1*b* are adhered by the conductive adhesive layer 4, the parts of the oscillatory elements are cut. According to this fabricating method, the cut portions 1*d* and 1*e* (FIG. 4C) are prepared by the single cutting operation (e.g., in the order of 1*d*→1*d*→1*d*→1*d*→1*e*→1*d* and so on) to shorten the cutting time. The conductive adhesive layer 4 which has been applied in advance is slightly cut at the cut portions 1*d*. Since the spacing between the cut portions 1*d* and 1*d* is about 0.15 mm, the conductive adhesive layer 4 may possibly be formed with cracks.

Another method, in which the above point is improved, will now be described with reference to FIGS. 5A to 5C. The steps 1 and 2 are the same as those previously described, and the following steps are taken thereafter:

Step 3: The oscillatory elements are cut at 1*d* into the tiny oscillatory elements as shown in FIG. 5B;

Step 4: As shown in FIGS. 5A and 5B, the electrode layer 1*b* of each tiny oscillatory element and each pattern 3*b* of the print plate 3 are connected by means of the conductive adhesive layer 4; and Step 5: As shown in FIG. 5C, cut portions 1*d* formed in the foregoing step 3 are more deeply cut, thereby cutting the conductive adhesive layer 4 (as indicated at 1*e* in FIG. 5C) such that a group consisting of the five tiny oscillatory elements are connected with one of the patterns.

After the above step 5, step 5 illustrated in FIGS. 4A to 4C is performed to effect the attachment to the common electrode lead.

Figure 5A:
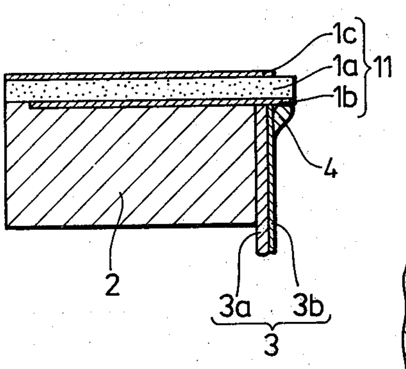
Figure 5B:
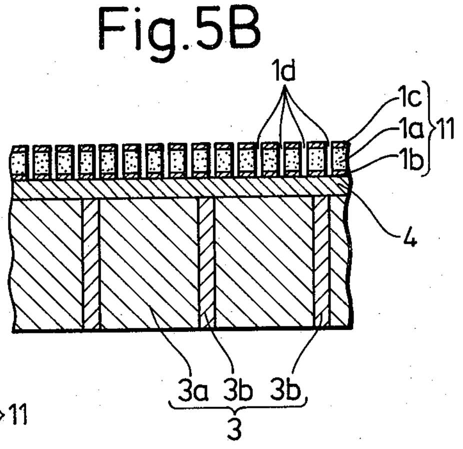
Figure 5C:
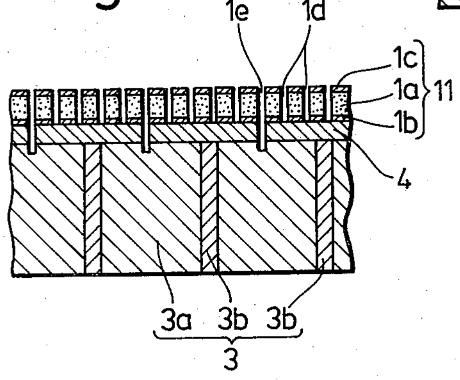

According to the fabricating method shown in FIGS. 5A to 5C, it is necessary to perform the cutting operations twice and to cut more deeply (at 1*e*) the portions 1*d* which have been cut in the previous step. Therefore, although more fabrication time is required than that for the transducer shown in FIGS. 4A to 4C, the conductive adhesive layer 4 is not cut at the cut portions 1*d*, in the manner described with reference to FIGS. 4A to 4C, but is deeply cut only at the cut portions 1*e*. Consequently, there is little danger of the array being formed with cracks.

Figure 6:
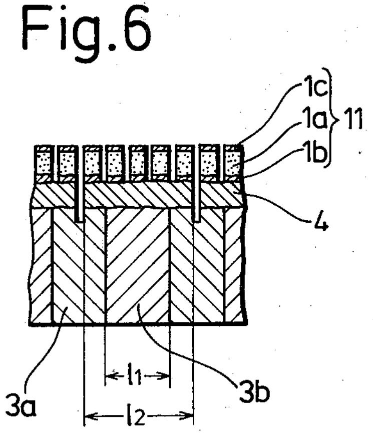
FIGS. 6 and 7 and FIGS. 8A to 8C are views illustrating the portions wherein the electrode layers of the array of the tiny oscillatory elements and the patterns of a print plate are connected by means of conductive adhesives.

Although the width of the patterns 3*b* shown in FIG. 4C and FIGS. 5B and 5C is similar to that of the tiny oscillatory elements 11, the patterns are not considered to be limited to those shown. For example, FIG. 6 shows a different configuration where the electrode layers 1*b* of the array of the tiny oscillatory elements 11 and the patterns 3*b* of the print plate are connected by the conductive adhesive layer 4. If the width of one group of the tiny oscillatory elements 11 (e.g., the width of the five tiny oscillatory elements in the embodiment of FIG. 6) is denoted at $l_2$ and if the width of the patterns 3*b* is denoted at $l_1$, it is sufficient that the relationship between the widths $l_1$ and $l_2$ be $l_1 \leqq l_2$. However, as will be apparent from FIG. 6, as the width $l_1$ becomes larger the accuracy for the arrangement of the print plate 3 becomes more strict.

Figure 7:
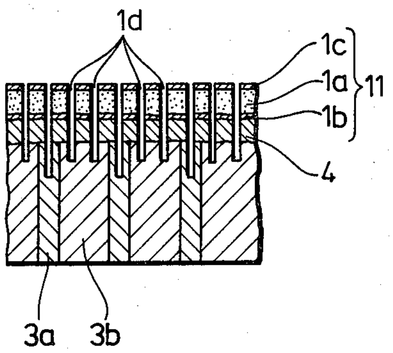

Although with respect to the embodiments illustrated in FIGS. 4A to 4C and FIGS. 5A to 5C, the description has been made by assuming that the number of the tiny oscillatory elements constituting one group is five, the number of the tiny oscillatory elements constituting the group is not limited thereby, but may vary, e.g., a single or a plurality of elements. As shown in FIG. 7, for example, the group may be composed of three tiny oscillatory elements.

As shown in FIG. 7, similar results according to the present invention can be attained even if the cut portions 1*d* are cut as deeply as the patterns 3*b* to provide a construction in which the respective tiny oscillatory elements 11 and the patterns 3*b* are connected by the conductive adhesive.

Figure 8A:
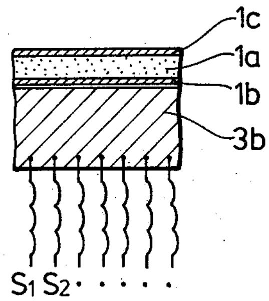
Figure 8B:
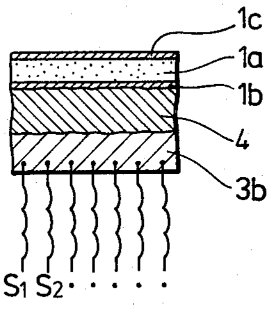
Figure 8C:
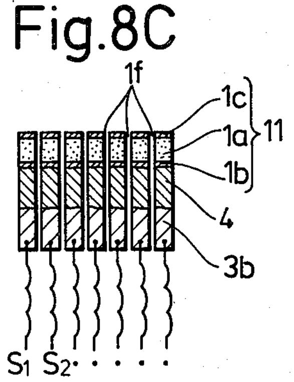

In the description thus far, there has been disclosed the embodiment, in which one group consisting of a plurality of the tiny oscillatory elements and the single pattern 3*b* (or the signal electrode lead) are connected by means of the conductive adhesive layer 4. However, FIGS. 8A to 8C show another embodiment, in which a single pattern 3*b* is connected with a single tiny oscillatory element by means of the conductive adhesive layer 4. More specifically, the print plate is formed with leads $S_1$, $S_2$, etc. in advance and the oscillatory elements are arranged in the form shown in FIG. 8A. Next, as shown in FIG. 8B, the patterns 3*b* of the print plate and the electrode layers 1*b* of the oscillatory elements are connected by the conductive adhesive layer 4. Then, the oscillatory elements, the conductive adhesive layer 4 and the print plate are so cut that each of the leads $S_1$, $S_2$, etc. are connected to a single tiny oscillatory element.

The transducer, which is fabricated by connecting the single pattern (or the signal electrode lead) 3*b* with the single tiny oscillatory element 11 by the conductive adhesive layer 4, as shown in FIG. 8C, is suitable for the ultrasonic diagnostic examination device of the sector scanning type.

Figure 9A:
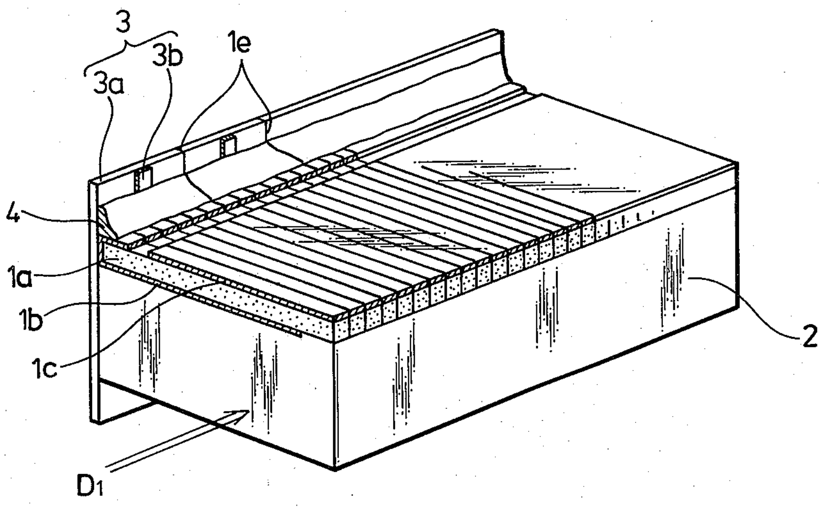
Figure 9B:
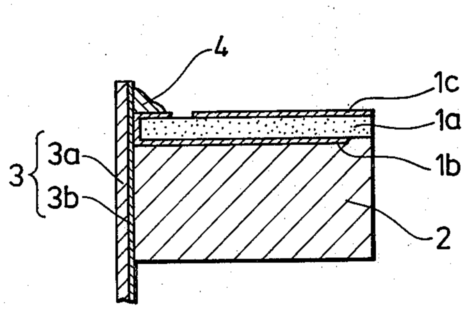
Figure 9C:
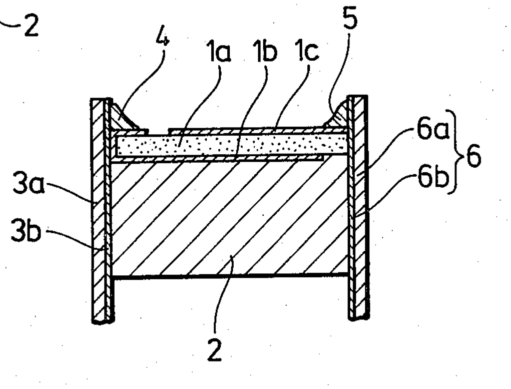

The oscillatory elements, which have been described with reference to FIGS. 4A to 4C and FIGS. 5A to 5C, are respectively equipped on each of their sides with one electrode layer. However, the present invention can be practiced even if the oscillatory elements employ a run-around electrode construction as shown in FIGS. 9A to 9C in which one side electrode 1*b* extends to the other side.

The method of fabricating the transducer shown in FIGS. 9A to 9C will now be described. After the parts of the oscillatory elements and the backing member 2 are adhered, the former are cut into the tiny oscillatory elements. After that, the print plate is so arranged that its pattern side faces the run-around portion of the run-around electrode 1*b*, and the respective patterns 3*b* and the electrode layers 1*b* of the respective tiny oscillatory elements are connected by means of the conductive adhesive layer 4. After that, every four grooves of the cut portions, which are formed by previously cutting the parts of the oscillatory elements, are cut in a tracing manner so that the conductive adhesive layer is cut. As a result, the electrode layers 1*b* of the five tiny oscillatory elements are connected with each of the patterns 3*b*, as shown in FIG. 9A. Thus, the signal electrode leads are extracted as the respective patterns 3*b*. Although not shown in FIGS. 9A and 9B, after the aforementioned fabricating process, the common electrode lead is assembled, as shown in FIG. 9C, by connecting the patterns 6*b* of the print plate 6 and the electrode layers 1*c* of the respective tiny oscillatory elements by the conductive adhesive layer 5.

Figure 10:
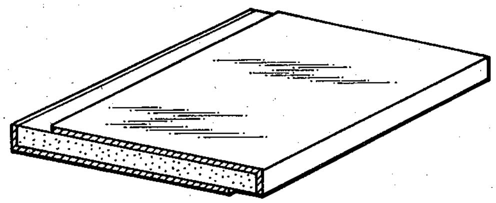
FIG. 10 is a perspective view illustrating the construction of the electrode of the member of the oscillatory element.

Similar results to those of the aforementioned embodiment can be attained in cases where the oscillatory elements have the electrode construction shown in FIG. 10. However, the description of the transducer having the structure shown in FIG. 10 will be omitted here because the oscillatory elements shown in FIG. 10 are prepared by making electrode layers of the oscillatory elements, used in the transducer shown in FIGS. 4A and 5A, run around merely in the thickness direction.

The transducer in accordance with the present performance of the ultrasonic diagnostic invention, can be fabricated with ease in a short time period without being defective. Accordingly, the present invention can enjoy remarkably high results. Moreover, the transducer according to the present invention improves the performance of ultrasonic diagnostic devices by producing an image having high resolution.

What is claimed is:

1. A linear array ultrasonic transducer comprising: an ultrasonic absorber; an array of tiny oscillatory elements having two electrode layers, said array positioned on one side of said ultrasonic absorber; a print plate having a plurality of electrode lead patterns mounted on the side of said ultrasonic absorber generally at a right angle with respect to one end portion of said tiny oscillatory elements; a conductive adhesive layer having a plurality of cut sections corresponding to said electrode lead patterns for electrically connecting said electrode layers of said tiny oscillatory elements and said electrode lead patterns on said print plate; and first and second matching layers and an acoustic lens consecutively mounted on the other side of said tiny oscillatory elements.

2. The linear array ultrasonic transducer according to claim 1, wherein the first matching layer is made of glass.

3. The linear array ultrasonic transducer according to claim 1, wherein the second matching layer is made of a high molecular film.

4. The linear array ultrasonic transducer according to claim 1, wherein said acoustic lens is made of silicone rubber.

5. The linear array ultrasonic transducer according to claim 1, wherein said conductive adhesive layers are made of an adhesive of conductive epoxy resin.

6. A linear array ultrasonic transducer comprising: an ultrasonic absorber; an array of tiny oscillatory elements having two electrode layers, said array mounted on one side of said ultrasonic absorber; a first print plate having a plurality of electrode lead patterns, said first print plate mounted on one side of said ultrasonic absorber generally at a right angle with respect to one end portion of said tiny oscillatory elements, a second print plate having a common electrode lead pattern, said second print plate mounted on the other side of said ultrasonic absorber generally at a right angle with respect to the other end portion of said tiny oscillatory elements; a first conductive adhesive layer for electrically connecting the other of said electrode layers of said tiny oscillatory elements and said electrode lead patterns of said second print plate; and a glass layer, a high molecular film layer and a silicone rubber layer consecutively mounted on the other side of said tiny oscillatory elements.

* * * * *